(12) United States Patent
Abe (10) Patent No.: US 7,545,153 B2
(45) Date of Patent: Jun. 9, 2009

(54) CAPACITANCE DETECTING PROXIMITY SENSOR

(75) Inventor: Hiroshi Abe, Kanagawa (JP)

(73) Assignee: ACT · LSI Inc., Atsugi-shi (JP)

( * ) Notice: Subject to any disclaimer, the term of this patent is extended or adjusted under 35 U.S.C. 154(b) by 0 days.

(21) Appl. No.: 10/540,454

(22) PCT Filed: Dec. 25, 2003

(86) PCT No.: PCT/JP03/16805

§ 371 (c)(1),
(2), (4) Date: May 24, 2006

(87) PCT Pub. No.: WO2004/059343

PCT Pub. Date: Jul. 15, 2004

(65) Prior Publication Data

US 2006/0250142 A1      Nov. 9, 2006

(30) Foreign Application Priority Data

Dec. 25, 2002    (JP) .............................. 2002-373729

(51) Int. Cl.
G01R 27/26 (2006.01)
(52) U.S. Cl. ...................................... 324/663; 324/658
(58) Field of Classification Search ................... 324/663
See application file for complete search history.

(56) References Cited

U.S. PATENT DOCUMENTS

| | | | | |
|---|---|---|---|---|
| 3,311,696 A | * | 3/1967 | Melnick | 174/18 |
| 6,215,318 B1 | * | 4/2001 | Schoefthaler et al. | 324/658 |
| 6,456,198 B1 | * | 9/2002 | Kato et al. | 340/564 |
| 6,538,457 B2 | * | 3/2003 | Nakayama et al. | 324/662 |
| 6,744,258 B2 | * | 6/2004 | Ishio et al. | 324/548 |
| 7,116,117 B2 | * | 10/2006 | Nakano et al. | 324/688 |
| 7,154,393 B2 | * | 12/2006 | Okushima et al. | 340/562 |
| 2002/0024344 A1 | | 2/2002 | Kato et al. | |
| 2004/0145378 A1 | * | 7/2004 | Shoji et al. | 324/663 |

FOREIGN PATENT DOCUMENTS

| | | |
|---|---|---|
| JP | 05-196743 | 8/1993 |
| JP | 07-60185 | 6/1995 |
| JP | 10-262870 | 10/1998 |
| JP | 2000-028309 | 1/2000 |
| JP | 2001-026446 | 1/2001 |
| JP | 2001-035327 | 2/2001 |
| JP | 2002-036929 | 2/2002 |
| JP | 3350662 | 9/2002 |

\* cited by examiner

*Primary Examiner*—Vincent Q Nguyen
*Assistant Examiner*—Jeff Natalini
(74) *Attorney, Agent, or Firm*—Barnes & Thornburg LLP (57) ABSTRACT

A capacitance detecting proximity sensor forms a proximity detection range in a spatially open region, avoids the effects resulting from peripheral objects outside the detection target, and enables proximity detection with few malfunctions. The proximity sensor includes: a first detection electrode and a second detection electrode that are disposed to have a predetermined range difference h with respect to a detection direction Y in which a detection subject comes into proximity to the proximity sensor and are independent from a ground potential; and a proximity detection circuit that outputs, as a proximity detection output, the difference between a capacitance to ground Ca formed by the first detection electrode and a capacitance to ground Cb formed by the second detection electrode.

4 Claims, 9 Drawing Sheets

(PERSPECTIVE VIEW OF ELECTRODE PORTIONS)

FIG. 4A

(ENTIRE CROSS SECTION)

FIG. 4B (PERSPECTIVE VIEW OF ELECTRODE PORTIONS)

FIG. 5

(TOP VIEW OF ELECTRODE PORTIONS)
FIG.6A (A-A CROSS SECTION)
FIG.6B (B-B CROSS SECTION)
FIG.6C (A-A CROSS SECTION)
FIG.6D (B-B CROSS SECTION)
FIG.6E

CAPACITANCE DETECTING PROXIMITY SENSOR

CROSS-REFERENCE TO RELATED APPLICATIONS

This application is a U.S. national counterpart application of international application Ser. No. PCT/JP2003/016805 filed Dec. 25, 2003, which claims priority to Japanese application serial no. 2002-373729 filed Dec. 25, 2002.

TECHNICAL FIELD

The present invention relates to a proximity sensor that detects the proximity of an object by a change in capacitance, and is effectively used in a device for preventing fingers from being pinched in an automatic open/close door attached to a vehicle such as an automobile.

BACKGROUND ART

A capacitance detecting proximity sensor detects the proximity of an object (detection subject) such as a human body by measuring the change in capacitance arising due to that object. The principle of such detection is simple and has been known for a long time, but improvements for raising the precision, reliability, and ease-of-use of the detection continue even now, and various configurations have been proposed. The configurations of capacitance detecting proximity sensors can be broadly divided into two formats.

The first format detects/measures, with an appropriate method, the capacitance (capacitance to ground) that one detection electrode disposed facing an open space forms with respect to a common ground potential (or common reference potential). When a detection subject approaches the detection electrode, the capacitance to ground changes due to the affect of the detection subject. This change is measured and the proximity of the detection subject is detected. See for example Japanese Patent Application Laid-Open Publication (JP-A) No. 2001-35327.

The second format measures the capacitance (inter-electrode capacitance) formed between two mutually opposed detection electrodes. When a detection subject comes between the two electrodes, the inter-electrode capacitance changes due to the affect of the detection subject. This change is measured and the proximity of the detection subject is detected. See for example JP-A No. 2001-26446.

It has been made apparent by the present inventor that there are the following problems in the aforementioned techniques.

Namely, in the first format, by disposing the detection electrode facing the open space, the proximity of the detection subject from the open space can be detected. In other words, the detection range can be set to a spatially open region. Thus, an optional object such as human body or a fixed object, for example, can be made to serve as the detection target.

However, the capacitance to ground of the detection electrode disposed facing the open space is easily affected by the environment or certain peripheral objects outside of the detection target. When an object forming a large capacitance is present in the vicinity of the proximity sensor, this triggers a detection malfunction even if the object is at a non-proximate position outside of the detection target.

For example, in order to automatically prevent fingers from being pinched in a sliding or hinged automatic open/close door attached to a vehicle such as a wagon, whether or not a person's fingers are in a position where there is the danger of them being pinched is detected by measuring the change in the capacitance to ground, and the drive operation for closing the door is controlled on the basis of this detection. However, this detection is easily affected by the car body and the door and can easily malfunction. Because the car body and the door form a large capacitance between them and the detection electrode, it is easy for them to be erroneously detected even if they are in a non-proximate position. Even airborne matter such as raindrops and mist can trigger a detection malfunction.

In the second format, because the detection range can be substantially limited to the closed space between the two detection electrodes, the affects of peripheral objects that are present outside of the closed space can be reduced. However, objects that cannot enter this closed space cannot be made to serve as the detection targets. Optional objects such as human bodies or fixed objects cannot be made to serve as the detection targets. Moreover, even in the second format, airborne matter such as raindrops and mist can trigger a detection malfunction.

By disposing two detection electrodes on the same surface, the detection range can be formed in a spatially open region in the same manner as in the first format, but in this case the same problems as in the first format arise. See for example JP-A No. 2000-48964.

In this manner, although capacitance detecting proximity sensors have the advantages that their principle is simple and they can be configured relatively easily, it is easy for malfunctions resulting from the affects of peripheral objects outside the detection target to arise, and there have been problems in the precision, reliability, and ease-of-use of the detection. For this reason, there have been many inadequacies in using the sensors to prevent fingers from being pinched in automatic open/close doors in automobiles, and fundamental improvements have been needed.

DISCLOSURE OF THE INVENTION

The present invention was conceived in view of the above problems, and it is an object thereof to provide a capacitance detecting proximity sensor that can form a proximity detection range in a spatially open region, avoid the affects resulting from peripheral objects outside the detection target, and enable proximity detection with few malfunctions.

The capacitance detecting proximity sensor according to the present invention is basically characterized by the following matters (1) to (4):

(1) A capacitance detecting proximity sensor that includes a sensor structure and a sensor circuit and electrostatically detects when a detection subject has come into proximity within a difference threshold, wherein (2) the sensor structure houses a first detection electrode and a second detection electrode that are disposed in mutual proximity in a predetermined geometrical relationship and are mutually electrically independent, (3) the environment in which the first detection electrode and the second detection electrode are disposed in the sensor structure is differentiated and configured so that when the detection subject is present in the vicinity of the difference threshold, the electrostatic environmental condition between the detection subject and the first detection electrode and the electrostatic environmental condition between the same detection subject and the second detection electrode are different, and (4) the sensor circuit detects and outputs the difference between a capacitance to ground formed by the first detection electrode and a capacitance to ground formed by the second detection electrode.

The present invention also discloses the following technical matters (a) to (k) that can be appropriately employed in addition to the preceding fundamental technical matters.

(a) A shield electrode may be disposed in the sensor structure so as to surround another portion of the difference threshold vicinity excluding a front side portion of the difference threshold vicinity facing the detection subject, and the first detection electrode and the second detection electrode may be electrostatically shielded by the shield electrode excluding the front direction.

(b) The environment in which the first detection electrode and the second detection electrode are disposed in the sensor structure may be differentiated so that the spatial distance between the detection subject in the vicinity of the difference threshold and the first detection electrode and the spatial distance between the same detection subject and the second detection electrode are different.

(c) The dielectric constants of a first dielectric disposed at the front side of the first detection electrode facing the detection subject and a second dielectric disposed at the front side of the second detection electrode facing the detection subject may be made different, whereby the environment in which the first detection electrode and the second detection electrode are disposed in the sensor structure is differentiated.

(d) The second detection electrode may be disposed opposite from the front side of the first detection electrode facing the detection subject so that the second detection electrode is hidden from the difference threshold vicinity at a rear portion of the first detection electrode, whereby the environment in which the first detection electrode and the second detection electrode are disposed in the sensor structure is differentiated.

(e) The first detection electrode, the second detection electrode and the sensor structure may be configured in band-like shapes.

(f) The shield electrode may be formed in a rail shape having a substantially U-shaped cross section, with the first detection electrode and the second detection electrode being housed inside the U-shaped groove.

(g) The shield electrode may comprise a rail-shaped insulation retention member having a substantially U-shaped cross section and metal foil disposed on the outer side of the U-shaped cross section.

(h) The first detection electrode and the second detection electrode may be band-like conductors formed in comb-like shapes having teeth and disposed so that when the sensor structure is seen from the front side, the comb-like teeth alternately mesh together.

(i) The first detection electrode and the second detection electrode may be plurally divided, with the shield electrode individually surrounding the divided electrodes.

(j) The sensor circuit may include a first capacitance detection circuit that measures the capacitance to ground of the first detection electrode, a second capacitance detection circuit that measures the capacitance to ground of the second detection electrode, and a difference detection circuit that outputs the difference between the measured outputs of these two capacitance detection circuits.

(k) The first and second capacitance detection circuits may be switched capacitor-format capacitance detection circuits.

BEST MODE FOR CARRYING OUT THE INVENTION

Figure 1:
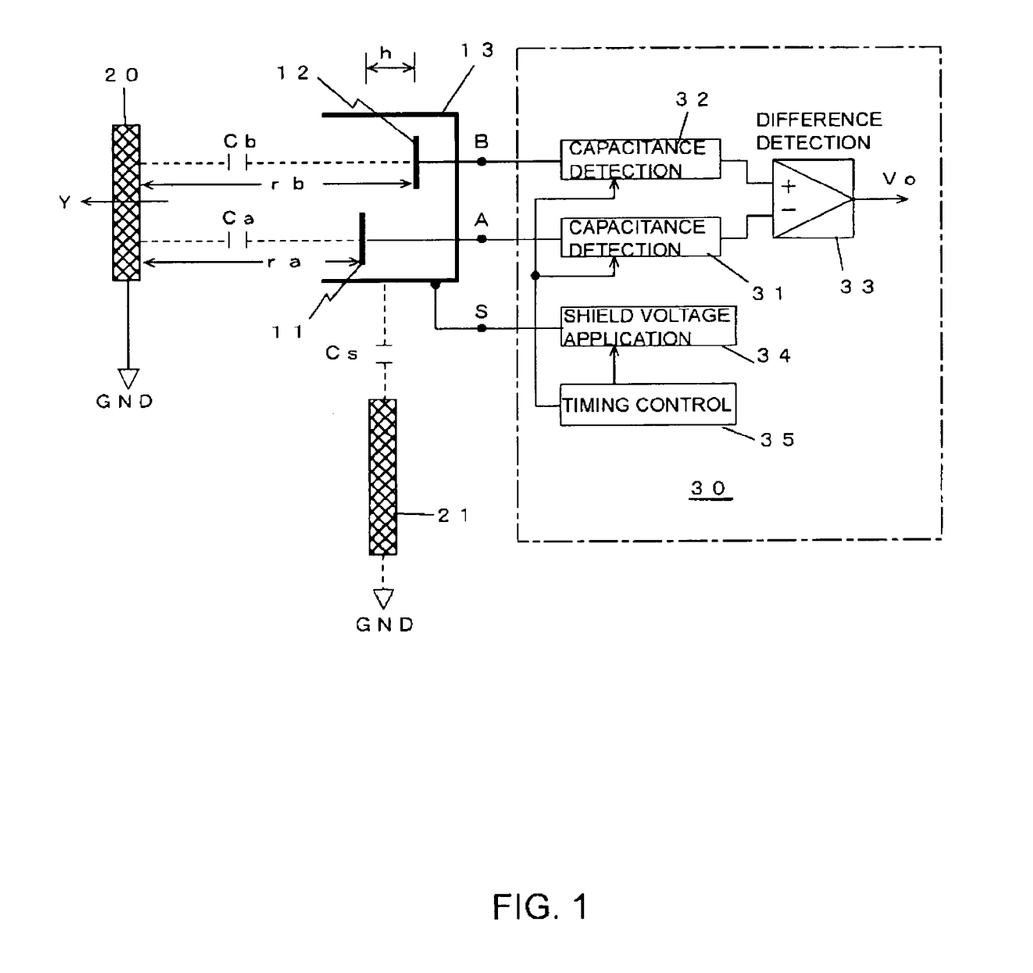
FIG. 1 is an abbreviated cross-sectional view and block diagram showing the relevant portions of a capacitance detecting proximity sensor pertaining to an embodiment of the present invention.

FIG. 1 is an abbreviated cross-sectional view and block diagram showing the relevant portions of a capacitance detecting proximity sensor pertaining to an embodiment of the present invention. The proximity sensor shown in FIG. 1 is configured using two detection electrodes—a first detection electrode 11 and a second detection electrode 12—and a shield electrode 13. The first detection electrode 11 and the second detection electrode 12 both face a detection direction Y in which a detection subject 20 approaches, and are both disposed so that they have a predetermined range difference h with respect to the detection direction Y.

The shield electrode 13 surrounds the two detection electrodes 11 and 12 to selectively electrostatically shield the direction (non-detection direction) other than the detection direction Y. Each of the electrodes 11, 12 and 13 is connected to a proximity detection circuit 30. The proximity detection circuit 30 is configured by two capacitance detection circuits—a first capacitance detection circuit 31 and a second capacitance detection circuit 32—and a difference detection circuit 33, a shield voltage application circuit 34, and a timing control circuit 35.

The first and second detection electrodes 11 and 12 are mutually independent floating electrodes and configured to form capacitances (capacitance to grounds) Ca and Cb with respect to a common ground potential (common reference potential) GND. The capacitance to grounds Ca and Cb formed by the two detection electrodes 11 and 12 are individually detected/measured by the first and second capacitance detection circuits 31 and 32. Each measured output is inputted to the difference detection circuit 33. The difference detection circuit 33 outputs the difference (Ca−Cb) between the two measured outputs (Ca and Cb). Information for determining the proximity of the detection subject 20 is included in the difference output Vo. Specifically, the level state of the difference output Vo reflects whether or not the detection subject 20 is proximate.

The shield electrode 13 is independent from both the first and second detection electrodes 11 and 12. A shield voltage that has the same potential as those of the first and second detection electrodes 11 and 12 is applied by the shield voltage application circuit 34 to the electrode 13. For this reason, the capacitance detection circuits 31 and 32 are configured to measure the capacitance to grounds Ca and Cb while applying the same potentials to the first and second detection electrodes 11 and 12. Thus, an electrical charge is not charged or discharged between the first and second detection electrodes 11 and 12 and the shield electrode 13, and the capacitances therebetween are equivalently cancelled.

It is not invariably necessary for the shield voltage to always be applied. It suffices for the shield voltage to be applied only when the capacitance to grounds of the first and second detection electrodes 11 and 12 are measured. Specifically, the application of the shield voltage may be started at a timing slightly before the capacitance detection circuits 31 and 32 begin capacitance measurement, and the application of the shield voltage may be stopped when the measurement operation by the capacitance detection circuits 31 and 32 is stopped. For this reason, in the embodiment shown in FIG. 1, the timing between the capacitance detection circuits 31 and 32 and the shield voltage application circuit 34 is synchronized by the timing control circuit 35.

The first and second detection electrodes 11 and 12 are electrically shielded from the non-detection direction by the shield electrode 13, and form the capacitances Ca and Cb only with respect to the detection direction Y. The capacitances Ca and Cb are changed by the detection subject 20 approaching from the detection direction Y. A peripheral object 21 present in the non-detection direction forms a capacitance (parasitic capacitance) Cs between itself and the shield electrode 13, but the capacitances Ca and Cb are shielded from any affects.

The first and second electrodes 11 and 12 and the capacitance detection circuits 31 and 32 are connected by insulated conductive wires (shielded wires) covered by a shield conductor, and the shield conductors of these shielded wires are connected to the same potential as the shield electrode 13. Thus, stray capacitances parasitic to the conductive wires for connecting the detection electrodes 11 and 12 and the capacitance detection circuits 31 and 32 are equivalently cancelled, and affects on the detection of the capacitances Ca and Cb can be avoided.

Here, when the detection subject 20 in the detection direction Y is separated from the two detection electrodes 11 and 12 by distances ra and rb, both distances ra and rb can be regarded as being substantially the same (ra/rb≈1). In this case, a large difference does not arise between the capacitance Ca formed by the one detection electrode 11 and the capacitance Cb formed by the other detection electrode 12 with respect to the detection subject 20. This state appears in the level state (small level) of the difference output Vo. Thus, the non-proximity of the detection subject 20 can be determined from the level state (small level) of the difference output Vo.

When the detection subject 20 approaches the detection electrodes 11 and 12, the ratio (rb/ra) between the distance ra to the one detection electrode 11 and the distance rb to the other detection electrode 12 increases. When this happens, a large difference (Ca>>Cb) arises between the capacitance Ca formed by the one detection electrode 11 and the capacitance Cb formed by the other detection electrode 12 with respect to the detection subject 20. This state appears in the level state (large level) of the difference output Vo. Thus, the proximity of the detection subject 20 can be determined from the level state (large level) of the difference output Vo.

The capacitance between the two conductors increases in inverse proportion to their distance, but the increase curve is logarithmical and suddenly rises from where there is less distance. Where the detection subject 20 is separated to an extent from the two detection electrodes 11 and 12 by the distances ra and rb, the capacitances formed (Ca≈Cb) by the two detection electrodes 11 and 12 do not increase that much and the change resulting from the distances ra and rb is slow, but when the distances ra and rb become equal to or less than a certain extant (rb/ra>1), the capacitances sharply increase. This sharp increase arises first in the detection electrode 11 that is closer to the detection subject 20. Thus, the difference (Ca−Cb) between the two capacitances (capacitance to grounds) Ca and Cb sharply increases. Thus, by measuring the two capacitances Ca and Cb and calculating the difference output Vo, the level state of the difference output Vo greatly changes (sharply increases) when the detection subject 20 has come into proximity to a certain extent to the proximity sensor.

In this manner, when the detection subject 20 approaches the proximity sensor, the level state of the difference output Vo reacts as if there were a set distance threshold and clearly indicates whether or not the detection subject 20 is proximate. Thus, the range of proximity detection can be formed in a spatially open region, the affects resulting from the peripheral object 21 outside of the detection target can be avoided, and proximity detection with few malfunctions becomes possible. The distance threshold at which the difference output Vo begins to react greatly can be optionally set by the range difference h of the two detection electrodes 11 and 12 with respect to the detection direction Y.

The capacitances Ca and Cb arising in the two detection electrodes 11 and 12 also change due to airborne matter such as raindrops and mist, but because such airborne matter are in a dispersed state, the changes in the capacitances Ca and Cb resulting from these appear in the same manner in the two detection electrodes 11 and 12. Thus, the degree to which the proximity detection operation is disturbed by airborne matter is extremely small and can be substantially ignored. In other words, detection malfunctions resulting from airborne matter such as raindrops and mist can be reliably avoided.

Figure 2A:
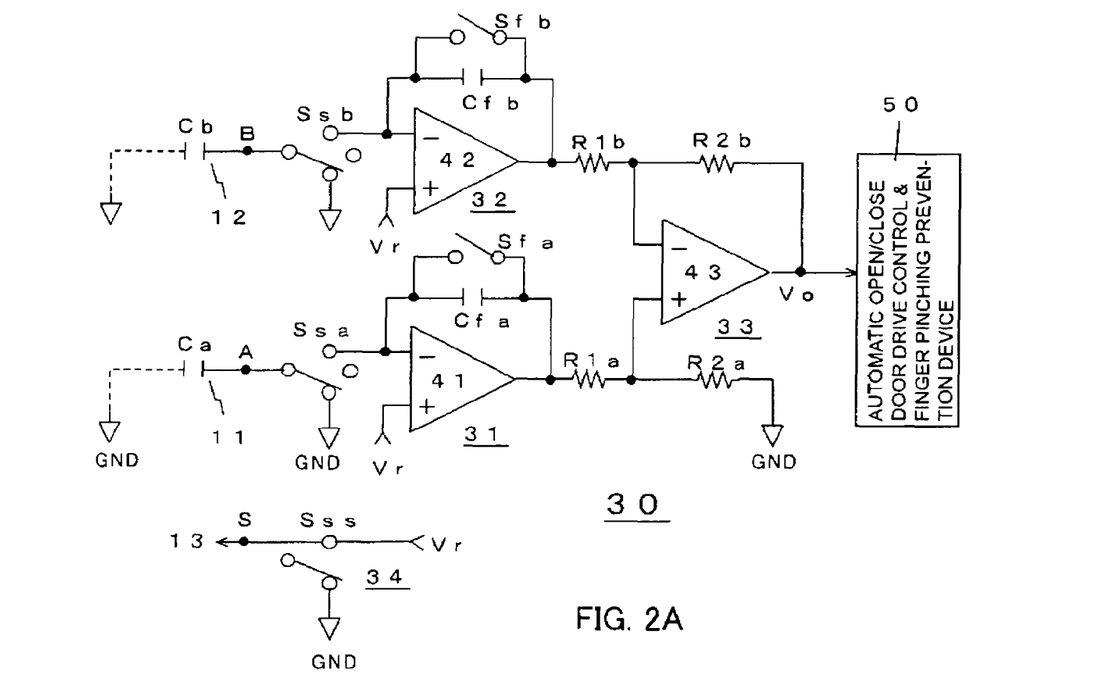
FIG. 2A is a circuit diagram and FIG. 2B is an operational timing chart showing a specific example of the configuration of the relevant portions of a proximity detection circuit.
Figure 2B:
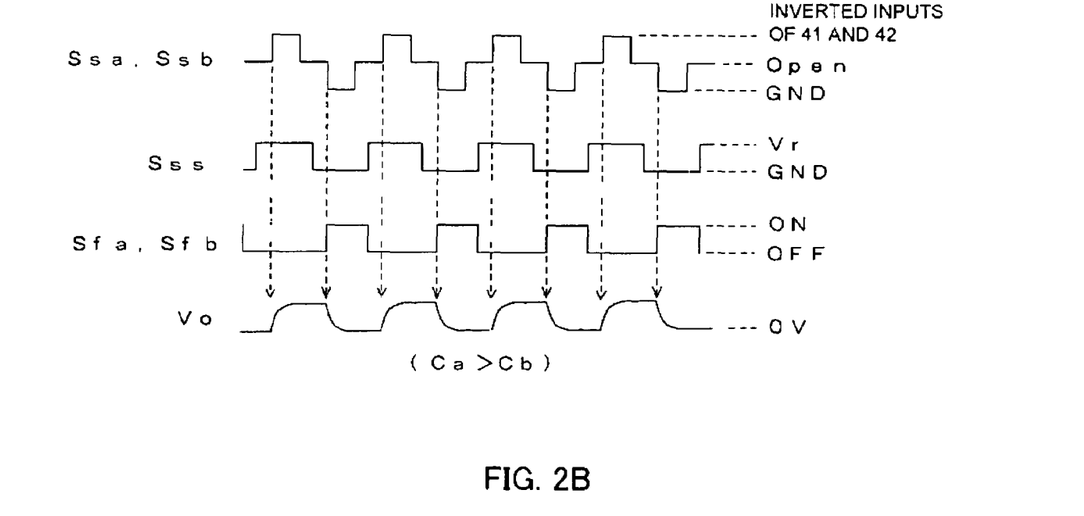

FIG. 2A shows an example of the configuration of the relevant portions of the proximity detection circuit 30, and FIG. 2B shows an operation timing chart of the proximity detection circuit 30. In FIGS. 2A and 2B, the places indicated by reference letters A, B and S correspond to the places indicated by reference letters A, B and S in FIG. 1. The circuit 30 shown in FIGS. 2A and 2B is configured by operational amplifiers 41, 42 and 43, capacitor elements Cfa and Cfb, resistors R1a, R1b, R2a and R2b, and active switches Ssa, Ssb, Sss, Sfa and Sfb.

The operational amplifier 41, the capacitor element Cfa and the active switches Ssa and Sfa configure the first capacitance detection circuit 31. The operational amplifier 42, the capacitor element Cfb and the active switches Ssb and Sfb configure the second capacitance detection circuit 32. The operational amplifier 43 and the resistors R1a, R1b, R2a and R2b configure the difference detection circuit 33.

The first and second capacitance detection circuits 31 and 32 individually detect/measure the capacitance to grounds Ca and Cb of the first and second detection electrodes 11 and 12 by a switched capacitor operation. The switched capacitor operation is conducted by the first active switches Ssa and Ssb, which are periodically switched at the timing shown in FIG. 2B, and by the second active switches Sfa and Sfb, which are periodically switched ON and OFF at the timing shown in FIG. 2B.

The capacitance to grounds Ca and Cb of the detection electrodes 11 and 12 are periodically switched by the first active switches Ssa and Ssb between the inverted inputs (−) of the operational amplifiers 41 and 42, an open position (Open) of high impedance, and the ground potential GND. The non-inverted inputs (+) of the operational amplifiers 41 and 42 are connected to a predetermined reference potential Vr, and the capacitor elements Cfa and Cfb are connected between the inverted inputs (−) and amp outputs to form one kind of negative feedback amplifier circuit. The capacitor elements Cfa and Cfb form the negative feedback path. The second active switches Sfa and Sfb are connected in parallel to the capacitor elements Cfa and Cfb.

When the capacitance to grounds Ca and Cb of the detection electrodes 11 and 12 are connected to the inverted inputs (−) of the operational amplifiers 41 and 42 via the first active switches Ssa and Ssb and when the second active switches Sfa and Sfb are OFF, a voltage corresponding to the capacitance ratio (impedance ratio) between the capacitance to grounds Ca and Cb and the capacitor elements Cfa and Cfb appears in the outputs of the operational amplifiers 41 and 42 due to the negative feedback operation causing a virtual short between the inverted inputs (−) and the non-inverted inputs (+).

This output voltage is maintained until the second active switches Sfa and Sfb turn to ON even after the capacitance to grounds Ca and Cb have been switched from the inverted inputs (−). When the second active switches Sfa and Sfb turn from OFF to ON, the capacitor elements Cfa and Cfb are shorted/discharged and the output voltage is reset. At this time, the switch positions of the first active switches Ssa and Ssb are switched to the ground potential GND, and the capacitance to grounds Ca and Cb are also discharged/reset. After a predetermined period of time of this reset operation, the second active switches Sfa and Sfb are again switched to OFF and cause the capacitor elements Ca and Cb to be intervened in the negative feedback path. In this state, the first active switches Ssa and Ssb again connect the counter group capacitances Ca and Cb to the inverted inputs (−) of the operational amplifiers 41 and 42. When this happens, a voltage corresponding to the capacitance ratio (impedance ratio) between the capacitance to grounds Ca and Cb and the capacitor elements Cfa and Cfb again appears in the outputs of the operational amplifiers 41 and 42. This operation is repeated and the capacitance to grounds Ca and Cb are periodically measured. The measured output voltage is periodically updated and outputted from the operational amplifiers 41 and 42.

The reference potential Vr that is the same as that applied to the non-inverted inputs (+) of the operational amplifiers 41 and 42 is applied, via the third active switch Sss, to the shield electrode 13. The third active switch Sss is actuated to apply the reference potential Vr to the shield electrode 13 during the period when at least the connection positions of the first active switches Sfa and Sfb are at the inverted inputs (−) side of the operational amplifiers 41 and 42, i.e., during the period when the measurement of the capacitance to grounds Ca and Cb is being conducted. The reference potential Vr is applied to the detection electrodes 11 and 12 also by the virtual short operation resulting from the operational amplifiers 41 and 42 during this measurement operation period. Thus, the capacitances between the detection electrodes 11 and 12 and the shield electrode 13 are equivalently cancelled.

The difference detection circuit 33 outputs the difference between the measured voltages outputted from the operational amplifiers 41 and 42. The timing chart in FIG. 2B shows a state where the capacitance to ground Ca of the first detection electrode 11 is greater than the capacitance to ground Cb of the second detection electrode 12, i.e., a state where the detection subject 20 has come into proximity to the proximity sensor. The level of the difference output Vo is applied as control information for a finger pinching prevention operation to a drive control circuit 50 that controls the open/close operation of an automatic open/close door in a vehicle.

The two capacitance detection circuits 31 and 32 may be configured to mutually have the same characteristics (pair characteristics), but by setting the detection gain of the one capacitance to ground Ca to be smaller than that of the other capacitance to ground Cb, or by varying the transmission gain of the difference detection circuit 33 between inputs, the polarity of the difference output Vo can also be inverted between the proximity detection time and the non-detection time.

Figure 3A:
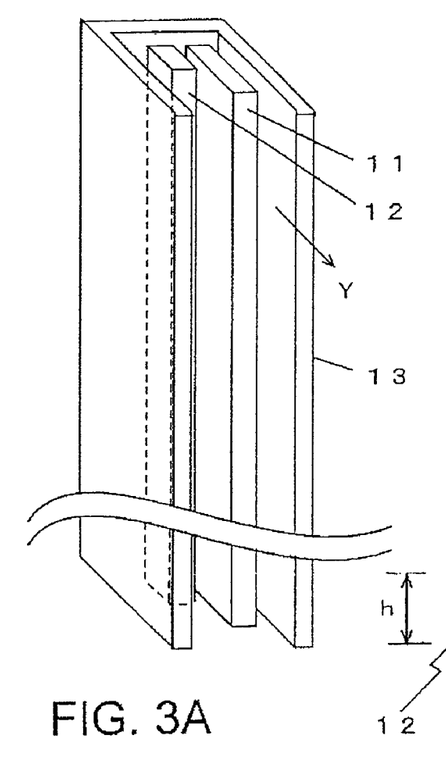
FIG. 3A is a perspective view and FIG. 3B is a cross-sectional view showing an embodiment of detection-use electrodes.
Figure 3B:
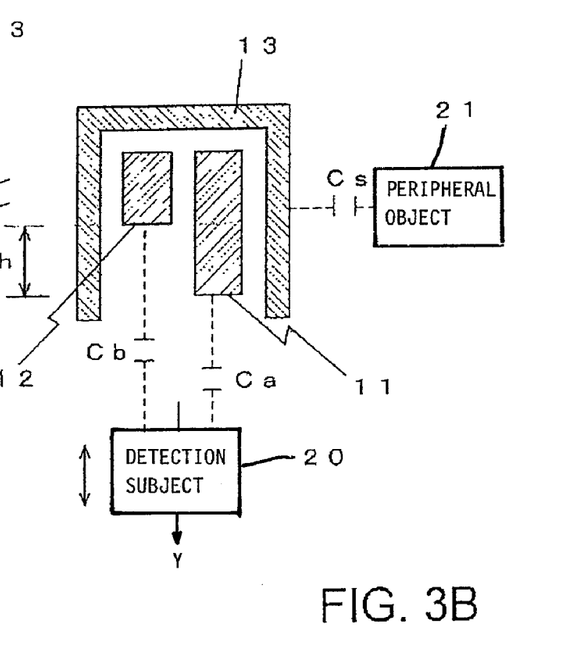

FIGS. 3A and 3B show a specific embodiment of the detection-use electrodes (11-13). In the embodiment shown in FIGS. 3A and 3B, the two detection electrodes 11 and 12 are formed by conductors (metal plates) that are cross-sectionally rectangular, band-like and long. The shield electrode 13 is formed in a rail shape having a substantially U-shaped cross section. The two detection electrodes 11 and 12 are housed within the U-shaped groove of the shield electrode 13 in a state where they are mutually parallel. Although it is not shown, the electrodes 11, 12 and 13 are electrically insulated from each other by an appropriate insulator. By making the width of the one detection electrode 11 wider than the width of the other detection electrode 12, the predetermined range difference h can be imparted with respect to the detection direction Y. According to this configuration, the detection-use electrodes (11 to 13) can be formed in optional lengths. Flexibility can also be imparted by using a flexible material. Thus, a proximity sensor for preventing fingers from being pinched can also be disposed along the center pillar serving as the door frame in an automobile.

Figure 4A:
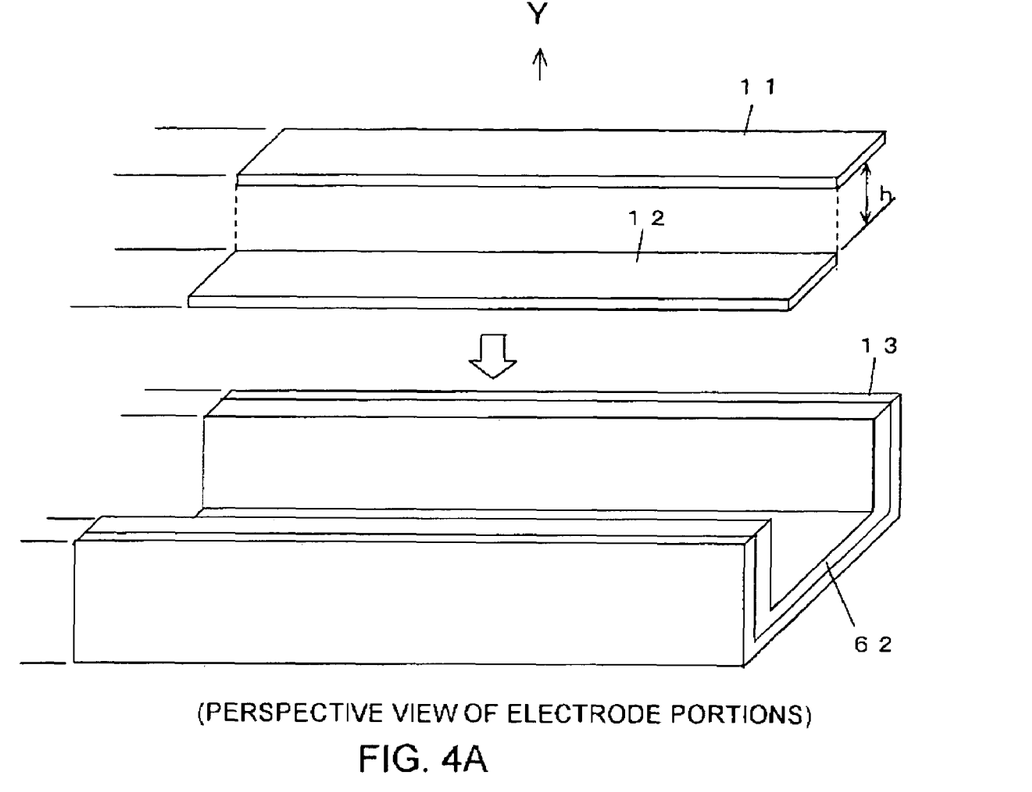
FIG. 4A is a perspective view and FIG. 4B is a cross-sectional view showing another embodiment of the detection-use electrodes.
Figure 4B:
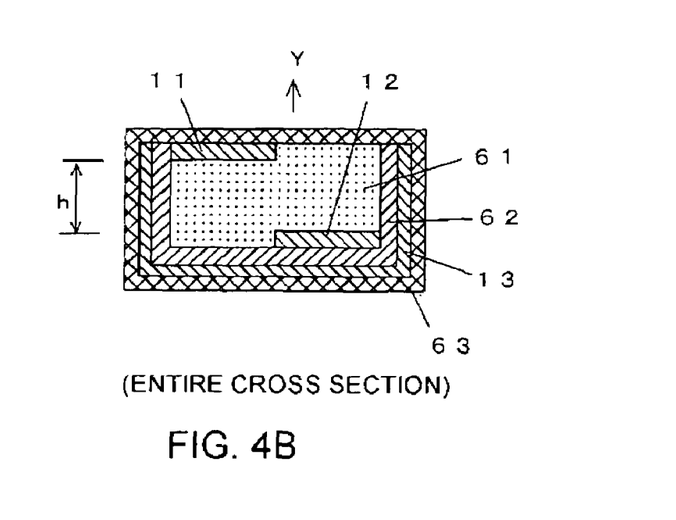

FIGS. 4A and 4B show another embodiment of the detection-use electrodes (11 to 13). In the embodiment shown in FIGS. 4A and 4B, the two detection electrodes 11 and 12 are formed by thin, band-like conductors (thin metal plates), and these are housed at different heights inside the rail-shaped shield electrode 13 having a substantially U-shaped cross section. The U-shaped groove of the shield electrode 13 is filled with an insulator 61 that has a low density and low permittivity, such as resin foam (polyethylene foam). The two detection electrodes 11 and 12 are disposed at the upper surface side and lower surface side of the insulator 61. The rail-shaped shield electrode 13 is configured by using a rail-shaped insulation retention member 62 that is made of resin and has a substantially U-shaped cross section, and adhering metal foil such as aluminum to the outer side of the U-shaped cross section of the insulation retention member 62. The entire product is covered/protected by a heat shrinkable tube 63.

Figure 5:
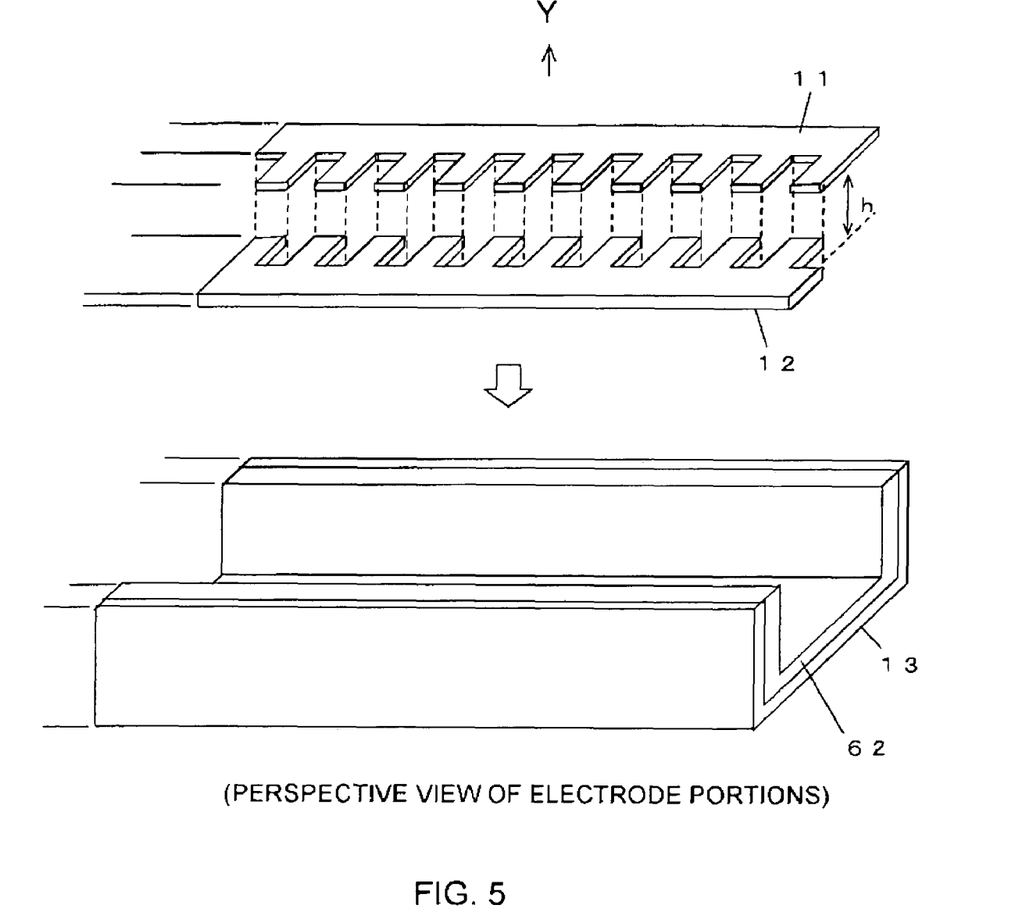
FIG. 5 is a perspective view showing yet another embodiment of the detection-use electrodes.

FIG. 5 shows yet another embodiment of the detection-use electrodes (11 to 13). In the embodiment shown in FIG. 5, the two detection electrodes 11 and 12 are formed by thin, band-like conductors (thin metal plates), and the band-like conductors are formed in comb-like shapes having teeth that alternately enter mutual regions when they are placed together on the same surface. The two detection electrodes 11 and 12 are housed at different heights inside the rail-shaped shield electrode 13 having a substantially U-shaped cross section. Similar to the shield electrode shown in FIGS. 4A and 4B, the rail-shaped shield electrode 13 is configured using a rail-shaped insulator 62 that is made of resin and has a U-shaped cross section and metal foil such as aluminum. In this embodiment, the two detection electrodes 11 and 12 are alternately disposed, whereby the effect of correcting the peak of proximity detection sensitivity from leaning towards the one detection electrode 11 can be obtained.

Figure 6A:
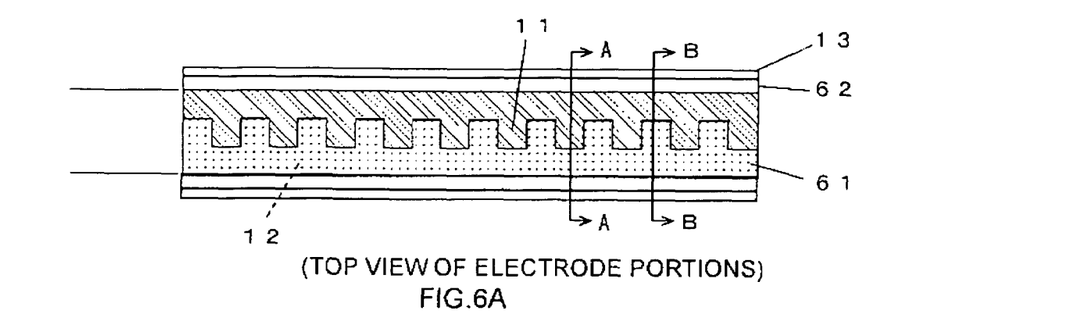
FIG. 6A is a top view and FIGS. 6B to 6E are cross-sectional views showing a state of completion of the detection-use electrodes shown in FIG. 5.
Figure 6B:
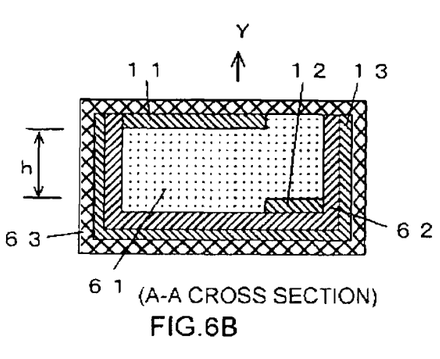
Figure 6C:
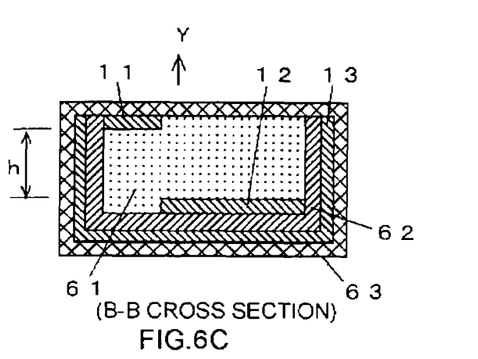
Figure 6D:
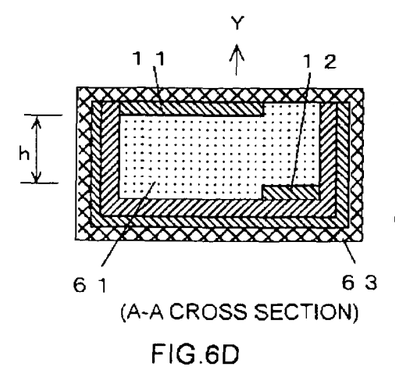
Figure 6E:
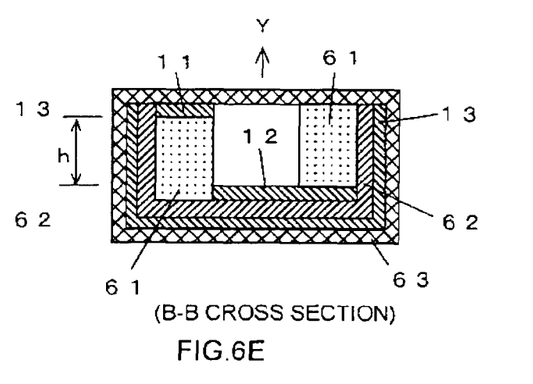

FIGS. 6A to 6E show a state of completion of the detection-use electrodes (11 to 13) shown in FIG. 5. FIG. 6A shows a top view in a state where the heat shrinkable tube 63 that is a cover member has been removed. FIG. 6B is a cross-sectional view along portion A-A of FIG. 6A. FIG. 6C is a cross-sectional view along portion B-B of FIG. 6A. In the embodiment shown in FIGS. 6A to 6C, all of the inside of the rail-shaped shield electrode 13 is filled with the insulator 61, but as shown in FIGS. 6D and 6E, the insulator 61 may be removed above the projecting portion of the detection electrode 12 positioned at the undersurface side. This has the effect of alleviating the range difference h between the detection electrodes 11 and 12 from being electrically shortened by the dielectric constant of the insulator 61.

Figure 7A:
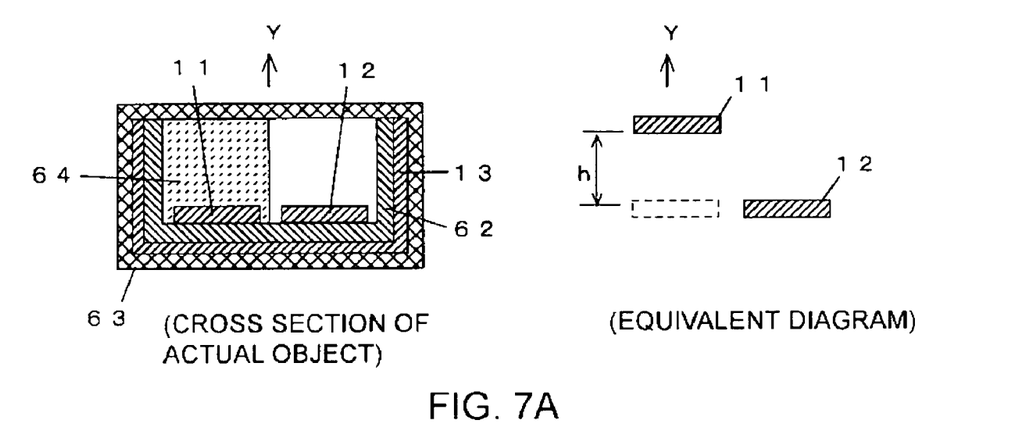
FIGS. 7A and 7B are cross-sectional views showing yet another embodiment of the detection-use electrodes.
Figure 7B:
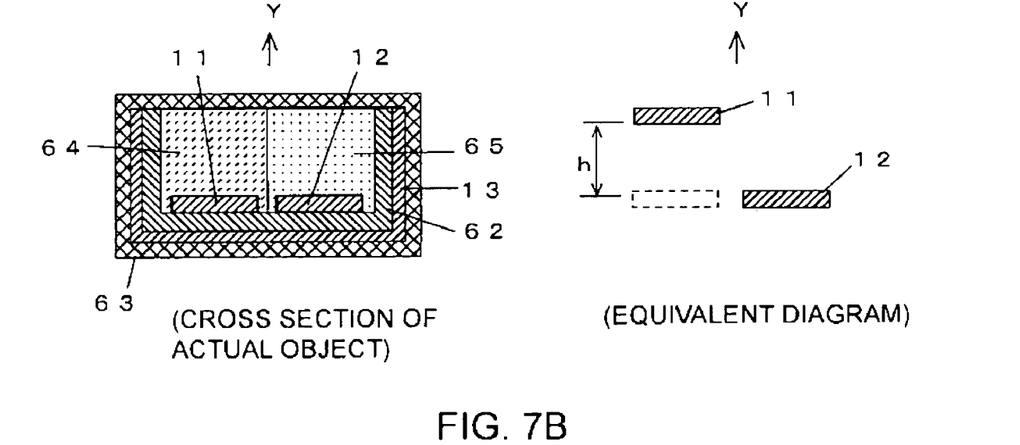

FIGS. 7A and 7B show yet another embodiment of the detection-use electrodes (11 to 13). The two detection electrodes 11 and 12 are disposed to have the predetermined range difference h with respect to the detection direction Y, but as shown in FIGS. 7A and 7B, the range difference h can also be formed electrically by the dielectric constants of dielectrics 64 and 65. In the embodiment shown in FIG. 7A, the dielectric 64 with a relatively high dielectric constant is intervened in front (in the detection direction Y) of only the one detection electrode 11 of the two detection electrodes 11 and 12 disposed on the same surface, whereby the predetermined range difference h is electrically formed. In the embodiment shown in FIG. 7B, the dielectrics 64 and 65 are intervened at both of the two detection electrodes 11 and 12 disposed on the same surface, and the dielectric constant of the one dielectric 64 is made relatively greater than that of the other dielectric 65, whereby the predetermined range difference h is electrically formed.

Figure 8:
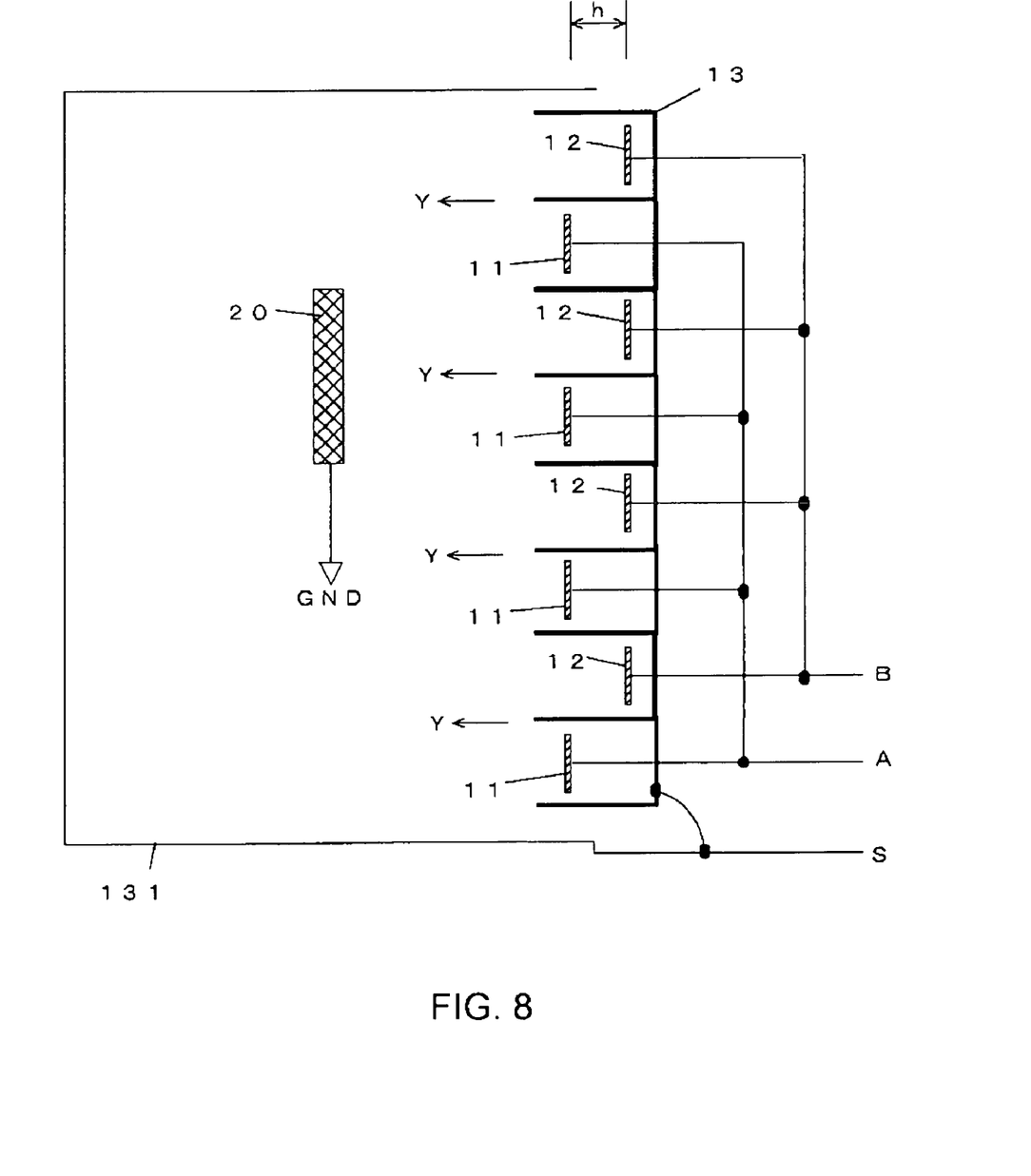
FIG. 8 is a schematic cross-sectional view showing another embodiment of the detection-use electrodes.

FIG. 8 shows another embodiment of the detection-use electrodes (11 to 13). As shown in FIG. 8, the first and second detection electrodes 11 and 12 may be plurally divided. The shield electrode 13 may individually surround and shield the divided electrodes 11 and 12. Moreover, as shown in FIG. 8, a shield-use conductor frame 131 that largely surrounds the space serving as the detection target maybe disposed separate from the shield electrode 13 of each of the detection electrodes 11 and 12, and the same potential as that of the shield electrode 13 may be applied to the conductor frame 131. In this case, the inducement cause of detection malfunction can be reliably eliminated.

Figure 9:
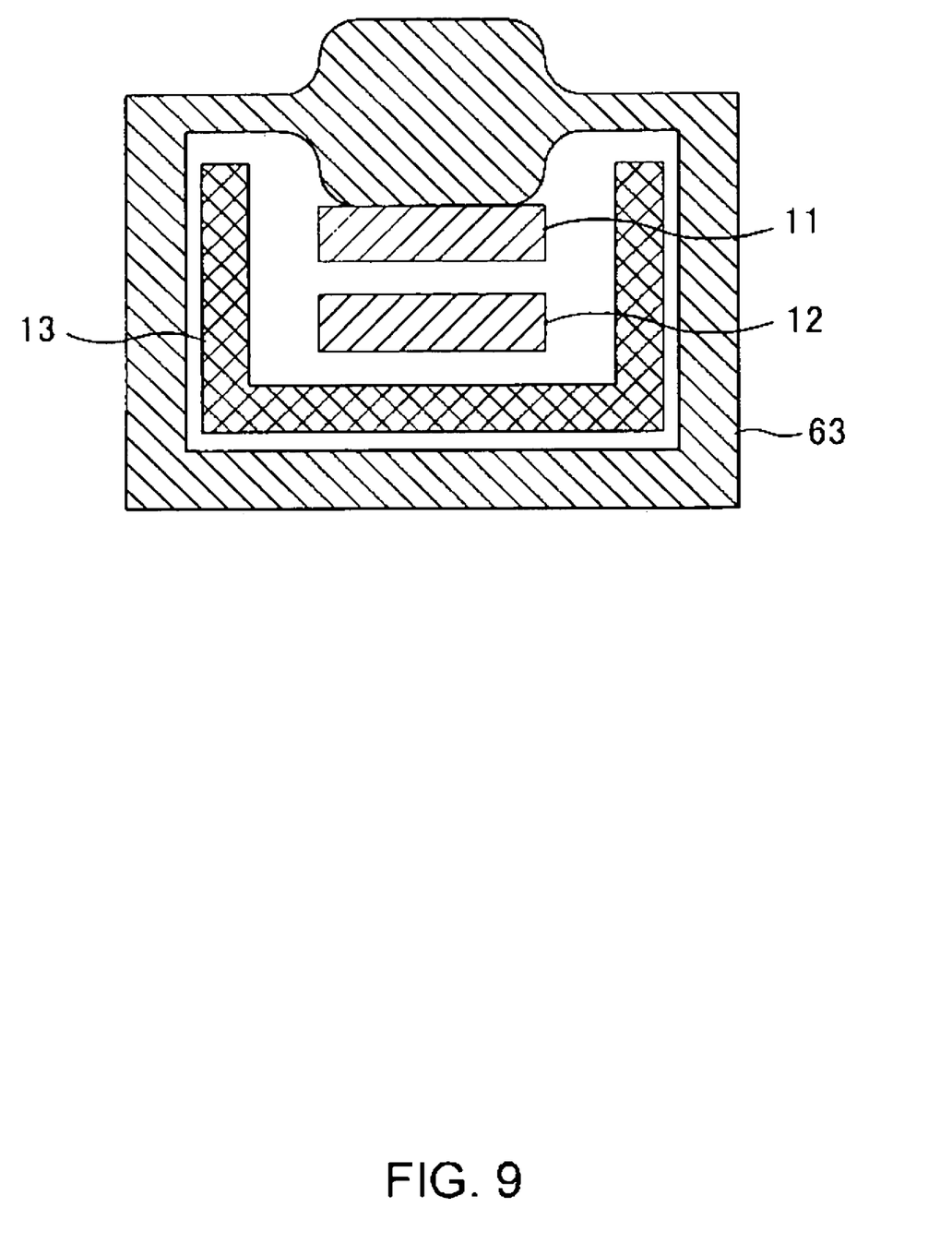
FIG. 9 is a cross-sectional view showing another embodiment of the detection-use electrodes.

FIG. 9 shows yet another embodiment of the detection-use electrodes (11 to 13). In the embodiment shown in FIG. 9, the first detection electrode 11 and the second detection electrode 12 are formed of thin band-like conductors (thin metal plates) and housed at different heights inside the rail-shaped shield electrode 13 having a substantially U-shaped cross section. More specifically, the second detection electrode 12 is disposed opposite from the front side of the first detection electrode 11 facing the detection subject, so that the detection electrode 12 is hidden from the difference threshold at the rear portion of the first detection electrode 11. Thus, the environment of the sensor structure in which the first detection electrode 11 and the second detection electrode 12 are disposed is differentiated. Spacers comprising appropriate elastic bodies are intervened at places between the first detection electrode 11 and the second detection electrode 12, so that an interval between the electrodes is maintained. The front side of the first detection electrode 11 is covered with a flexible material. Thus, when an object that is the detection subject presses the proximity sensor, the first detection electrode 11 is pushed inward by that object and contacts the second detection electrode 12. By disposing a separate electrical circuit to detect the fact that both of the electrodes 11 and 12 are in contact with each other, the function of a touch sensor can be added to the proximity sensor.

The present invention has been described on the basis of embodiments representative thereof, but various aspects of the present invention other than those described above are also possible. For example, the capacitance detection circuits 31 and 32 may be of a format other than the switched capacitor format, and configured to detect capacitance changes by oscillation frequency changes.

INDUSTRIAL APPLICABILITY

According to the present invention, a capacitance detecting proximity sensor can be provided which forms a proximity detection range in a spatially open region, avoids the affects resulting from peripheral objects outside the detection target, and conducts proximity detection with few malfunctions. This proximity sensor is suited for use in a device for preventing fingers from being pinched in an automatic open/close door in a vehicle.

What is claimed is:

1. A capacitance detecting proximity sensor that electrostatically detects when a detection subject has come into proximity within a difference threshold, comprising:
    a sensor structure housing a first detection electrode and a second detection electrode that are mutually electrically independent, both detecting surfaces of the first detection electrode and the second detection electrode being disposed opposing the detection subject that is approaching, the environment of the first detection electrode and the second detection electrode in the sensor structure being differentiated and configured so that when the detection subject is present in the vicinity of the difference threshold, the electrostatic environmental condition between the detection subject and the first detection electrode and the electrostatic environmental condition between the same detection subject and the second detection electrode being different; and
    a sensor circuit for detecting and outputting the difference between a capacitance to ground formed by the first detection electrode and a capacitance to ground formed by the second detection electrode,
    wherein the first detection electrode is divided into a plurality of first detection electrode divisions and the second detection electrode is divided into a plurality of second electrode divisions, and
    a shield electrode disposed to individually surround each first detection electrode division and each second detection electrode division so as to electrostatically shield each first detection electrode division and each second detection electrode division in at least one non-detection direction.

2. The capacitance detecting proximity sensor of claim 1, wherein the environment in which the first detection electrode and the second detection electrode are disposed in the sensor structure is differentiated so that the spatial distance between the detection subject in the vicinity of the difference threshold and the first detection electrode and the spatial distance between the same detection subject and the second detection electrode are different.

3. The capacitance detecting proximity sensor of claim 1, wherein the sensor circuit includes a first capacitance detection circuit that measures the capacitance to ground of the first detection electrode, a second capacitance detection circuit that measures the capacitance to ground of the second detection electrode, and a difference detection circuit that outputs the difference between the measured outputs of these two capacitance detection circuits.

4. The capacitance detecting proximity sensor of claim 3, wherein the first and second capacitance detection circuits are switched capacitor-type capacitance detection circuits.

* * * * *